United States Patent [19]

Kawano

[11] Patent Number: 4,818,903
[45] Date of Patent: Apr. 4, 1989

[54] TIME CONSTANT AUTOMATIC ADJUSTMENT CIRCUIT FOR A FILTER CIRCUIT

[75] Inventor: Mitsumo Kawano, Honjo, Japan
[73] Assignee: Kabushiki Kaisha Toshiba, Kanagawa, Japan
[21] Appl. No.: 74,723
[22] Filed: Jul. 17, 1987
[30] Foreign Application Priority Data
  Jul. 18, 1986 [JP] Japan ................. 61-169234
[51] Int. Cl.[4] ............................ H03K 3/20
[52] U.S. Cl. ............................. 307/521; 307/526
[58] Field of Search .............. 307/355, 521, 526; 328/133, 134, 167

[56] References Cited

U.S. PATENT DOCUMENTS 4,257,018 3/1981 Masdea et al. .............. 328/167 X
4,667,120 5/1987 Okada et al. .............. 328/167 X

FOREIGN PATENT DOCUMENTS 60-214617 10/1985 Japan .
 991505 5/1965 United Kingdom .
1586368 3/1981 United Kingdom .
2065946 7/1981 United Kingdom .

OTHER PUBLICATIONS

Moulding et al., "Gyrator Video Filter IC with Automatic Tuning," The Institute of Electrical and Electronic Engineers Journal of Solid-State Circuits, vol. SC-15, No. 6, pp. 963-967, Dec. 1980.

Primary Examiner—Eugene R. Laroche
Assistant Examiner—Steven J. Mottola
Attorney, Agent, or Firm—Finnegan, Henderson, Farabow, Garrett and Dunner

[57] ABSTRACT

An automatic adjustment circuit for adjusting the time constant of a filter circuit. The adjustment circuit includes a source of reference frequency signal, an oscillator for generating an oscillation signal, and a detector for detecting the difference in one of phase and frequency between the reference frequency signal and the oscillation signal and generating a control signal for automatically adjusting the time constant of the filter circuit.

9 Claims, 3 Drawing Sheets

TIME CONSTANT AUTOMATIC ADJUSTMENT CIRCUIT FOR A FILTER CIRCUIT

BACKGROUND OF THE INVENTION

1. Field of the Invention

The present invention relates to a time constant automatic adjustment circuit and, more particularly, to a time constant automatic adjustment circuit for a filter circuit incorporated into an IC.

2. Description of the Prior Art.

In general, a filter circuit employs a time constant circuit for determining the frequency characteristics of the circuit. The time constant circuit requires that the time constant of the circuit be maintained stably at a predetermined value. A time constant circuit is usually constituted by resistive elements and capacitive elements. When such a filter circuit is fabricated as an integrated circuit (referred as IC hereafter), it is necessary to adjust the time constant of the time constant circuit externally, since the resistances or the capacitances of the resistive elements and capacitive elements are not precise. Further, the resistances or the capacitances of the resistive elements and capacitive elements are unstable in relation to temperature change and long term use.

Referring now to FIGS. 1 to 4, some conventional adjustments for some typical filter circuits or time constant circuits will be explained. FIGS. 1 to 4 show four typical examples of a filter circuit, e.g., a low-pass filter.

First, the filter circuit shown in FIG. 1 has a time constant circuit comprised of a resistor 10 and a variable capacitor 12. The resistor 10 is connected between an input terminal 14 for receiving input signal Vin and an output terminal 16 for supplying output signal Vout. The variable capacitor 12 is connected between the output terminal 16 and a control terminal 18 for receiving a control signal Vc for adjustment. According to the connection of the resistor 10 and the variable capacitor 12, the time constant circuit forms a low-pass filter or an integrating circuit. The capacitance of the variable capacitor 12 varies in response to changes in the value of the control signal Vc on the control terminal 18.

The filter circuit shown in FIG. 2 has a time constant circuit comprised of a field effect transistor (referred as FET hereafter) 20 and a capacitor 22. The FET 20 is connected between an input terminal 14 for receiving an input signal Vin and an output terminal 16 for supplying output signal Vout. The capacitor 22 is connected between the output terminal 16 and a reference potential terminal, e.g., the grounded terminal 24. The FET 20 has a gate connected to a control terminal 18 for receiving a control signal Vc for adjustment. The impedance of the FET 20 varies in response to changes of the value of the control signal Vc on the control terminal Vc.

The filter circuit shown in FIG. 3 has a time constant circuit comprised of a bipolar transistor 26, a variable current source 28 and a capacitor 22. The base and the emitter of the bipolar transistor 26 are connected to an input terminal 14 for receiving an input signal Vin and an output terminal 16 for supplying output signal Vout, respectively. The collector of the bipolar transistor 26 is connected to a power source terminal 30 for receiving a power source voltage Vcc. The variable current source 28 is connected between the emitter of the bipolar transistor 26 and a reference potential terminal, e.g., the grounded terminal 24. The capacitor 22 is connected between the emitter of the bipolar transistor 26 and the grounded terminal 24, i.e., in parallel with the variable current source 28. The variable current source 28 is designed to receive a control signal Vc for adjustment on a control terminal 18. Thus, the current I28 of the variable current source 28 varies in response to the control signal Vc. The variable current source 28 supplies the bipolar transistor 26 with the variable current I28 in response to the control signal Vc, so that the equivalent emitter resistance of the bipolar transistor 26 is varied. The filter circuits, as shown in FIGS. 1 to 3, have a transfer characteristic G(LPF) as follows:

$$G(LPF) = 1/(1+j \cdot w \cdot R \cdot C) \qquad (1)$$

wherein j is the unit imaginary number ($\sqrt{-1}$), w is the angle frequency of the input signal Vin, R is the resistance or impedance of the resistor 10, the FET 20 or the bipolar transistor 26 and C is the capacitance of the variable capacitor 12 or the capacitors 22. The transfer characterisic G(LPF) is influenced by variations in the amplitude of the input signal Vin. That is, when the amplitude of the input signal Vin varies, the variable capacitor 12 (FIG. 1), the FET 20 (FIG. 2), and the bipolar transistor 26 (FIG. 3) are affected directly by the variation of the input signal Vin. Thus, a distorsion is caused in the output signal Vout. As a result, it is difficult for the filter circuits to exhibit their full performance.

The fourth filter circuit, as shown in FIG. 4, has been devised for reducing the distortion in the output signal Vout. The filter circuit shown in FIG. 4 has a time constant circuit comprised of a first differential amplifier circuit 32 and a capacitor 22. The first differential amplifier circuit 32 and the capacitor 22 are connected to each other through a current conversion circuit 34.

In the first differential amplifier circuit 32, a pair of transistors 36, 38 are connected at their collectors to a power source terminal 30 through a current conversion circuit 34 for receiving a power source voltage Vcc, and at their emitters to a grounded terminal 24 through a current source 40. The current source 40 supplies the first differential amplifier circuit 32 with a current I40. Resistors 42, 44 are connected between the current source 40 and the emitters of the transistors 36, 38, respectively. The base of the transistor 36 is connected to an input terminal 14 for receiving an input signal Vin, while the base of the transistor 38 is connected to an output terminal 16 for supplying output signal Vout through a voltage divider 46. The voltage divider 46 multiplies the output voltage Vout to m times (m is a decimal number, i.e., m < 1). In other words, the voltage divider 46 divides the output voltage Vout by 1/m. The divided voltage is applied to the base of the transistor 38 of the first differential amplifier 32. The divided voltage of m Vout is fed back from the output terminal 16 to the first differential amplifier 32 through the voltage divider 46. The current conversion circuit 34 is comprised of transistors 48, 50 ... 58, a reference voltage source 60 with a reference voltage Vref1 and a variable current source 28.

The transistors 48, 50 are connected between the power source terminal 30 and the collectors of the transistors 36, 38 of the first differential amplifier circuit 32, respectively. Their bases are commonly connected to the reference voltage source 60.

The transistors 52, 54 are connected at their collectors to the power source terminal 30 through the current mirror configuration active load circuit 64 and at their emitters to the grounded terminal 24 through the variable current source 28. The transistors 52, 54 thus constitute a second differential amplifier circuit 62. Their bases are connected to the collectors of the transistors 36, 38, respectively. The variable current source 28 is designed to receive a control signal Vc for adjustment on a control terminal 18. Thus, the current I28 of the variable current source 28 varies in response to the control signal Vc.

The transistors 56, 58 are connected between the power source terminal 30 and the collectors of the transistors 52, 54 of the second differential amplifier circuit 62, respectively. Their bases are commonly connected to the collector of the transistor 58. Accordingly, the transistors 56, 58 form a current mirror configuration active load circuit 64 for the second differential amplifier circuit 62. The collector of the transistor 56 is coupled to the output terminal 16 through a buffer amplifier 66. The capacitor 22 is connected between the collector of the transistor 52 and the grounded terminal 24.

The operation of the fourth filter circuit, as shown in FIG. 4, will be described.

When the input signal Vin on the input terminal 14 is applied to the base of the transistor 36 of the first differential amplifier circuit 32, collector currents I36 and I38 flow through the transistors 36, 38, respectively. The currents I36 and I38 also flow through the transistors 48, 50, respectively. Collector currents I52 and I54 flow through the transistors 52 and 54 of the second differential amplifier circuit 62 in the current conversion circuit 34, respectively. Since the bases of the transistors 48, 50 are connected with each other, the currents I36 and I38 have a relation defined by a logarithmic (Ln) characteristic of PN junctions in the transistors 48 and 50. Since the emitters of the transistors 52, 54 are connected with each other, the currents I52 and I54 have a relation defined by an exponential (Exp) characteristic of PN junctions in the transistors 52 and 54. As is well known, the logarithmic (Ln) characteristic and the exponential (Exp) characteristic compensate for each other. Thus, the following relation is maintained between the collector currents I36, I38, I52 and I54:

$$I36/I38 = I54/I52 \qquad (2)$$

Thereupon, the collector currents I36, I38, I52 and I54 are able to be expressed as follows:

$$I36 = I40/2 + \Delta i32$$

$$I38 = I40/2 - \Delta i32$$

$$I52 = I28/2 + \Delta i62$$

$$I54 = I28/2 - \Delta i62$$

wherein $\Delta i32$ is a variable component of a current flowing through the first differential amplifier 32, and $\Delta i62$ is a variable component of a current flowing through the second differential amplifier 62. From the above equations, the following equation for the variable component $\Delta i62$ is obtained:

$$i62 = (I28/I40) \cdot \Delta i32$$

The variable current component $\Delta i62$ flows into the capacitor 22 from both transistors 56, 58 of the second differential amplifier 62. The variable current component i62 from the transistor 56 directly flows into the capacitor 22. The variable current component $\Delta i62$ from the transistor 58 flows into the capacitor 22 via the current mirror configuration load circuit 64. Therefore, two times the variable current component $\Delta i62$, i.e., a current of $2 \cdot \Delta i62$, is fed into the capacitor 22. Thus, the output signal Vout on the output terminal 16 becomes as follows:

$$\begin{aligned} Vout &= 2 \cdot \Delta i62/j \cdot w \cdot C22 \\ &= (2 \cdot I28/I40) \cdot (\Delta i32/j \cdot w \cdot C22) \end{aligned} \qquad (3)$$

wherein C22 is the capacitance of the capacitor 22.

When this output signal Vout is negatively fed back to the first differential amplifier 32 through the voltage divider 46, the variable current component $\Delta i32$ of the first differential amplifier 32 is given as follows;

$$i32 = (Vin - m \cdot Vout)/(R42 + R44) \qquad (4)$$

wherein R42, R44 are resistances of the resistors 42, 44, respectively.

From the equations (3) and (4), the following equation is obtained:

$$Vout/Vin = 1/[m + j \cdot w \cdot C22 \cdot (R42 + R44) \cdot I40/(2 \cdot I28)] \qquad (5)$$

As is made clear from a comparison between the equations (1) and (5), these filter circuits shown in FIGS. 1 through 4 have the same frequency characteristic.

The time constant of the fourth filter circuit, as shown in FIG. 4, can be arbitrarily set if the conversion ratio of the current conversion circuit 34 is adjusted through the control of the current I28 of the variable current source 28. The conversion ratio of the current conversion circuit 34 can be adjusted through the control of the current I40 of the variable current source 40, instead of the control of the current I28 of the variable current source 28. That is, the current source of the first differential amplifier 32 is made variable and the current source of the second differential amplifier 62 is made constant.

In the fourth filter circuit, the variablity of the time constant responds to the variable current source 28 (or the current source 40), but not to the resistors 42, 44 or the capacitor 22. As a result, the variablity of the time constant does not respond to amplitude changes of the input signal Vin.

In the conventional filter circuits, as shown in FIGS. 1 to 4, the time constant of the filter caracteristics is apt to differ from designed value due to the inaccuracy of the resistances or the capacitances of the resistive elements and capacitive elements, e.g., the resistors R42, R44 and the capacitor 22. As a result, the time constant must be adjusted by the control of the current I28 and-/or I40 of the current sources 28, 40. Further, the time constant is apt to vary due to the unstableness of the resistances or the capacitances of the resistive elements and capacitive elements. Therefore, such an adjustment is required to be made as the occasion may demand. However, when the filter circuit is fabricated in an IC configuration, the need for such an adjustment of the time constant is undesirable. This is because the IC requires an additional pin for receiving the control voltage Vc for this adjustment. In the prior art, there is no suitable means to automatically carry out this adjustment. In the filter circuit, as shown in FIG. 4, a means to correct by utilizing the equivalent resistance obtained by switching the capacitance C22 of the capacitor 22 is present. However, this circuit is unfavorable in terms of noise caused by the switching, and it cannot be used in an analog IC.

SUMMARY OF THE INVENTION

Accordingly, an object of the present invention is to improve the drawbacks of the conventional filter circuits where external adjustment is required.

Another object of the present invention is to provide a time constant automatic adjustment circuit, which can be easily used in an IC.

It is another object of the invention to automatically adjust the time constant of a filter circuit without producing undesirable noise.

In order to achieve the objects, the time constant automatic adjustment circuit of the present invention comprises a source of reference frequency signal, an oscillator for generating an oscillation signal, and a detector for detecting the difference in one of phase and frequency between the reference frequency signal and the oscillation signal and generating a control signal for automatically adjusting the time constant of the filter circuit.

DESCRIPTION OF THE PREFERRED EMBODIMENTS

Figure 1:
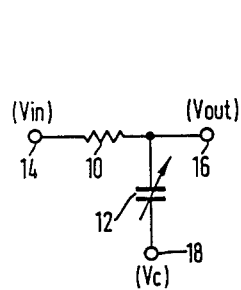
FIGS. 1, 2, 3 and 4 are circuit diagrams to explain the adjustment means of the conventional filter circuit, respectively.

The present invention will now be described in detail with reference to the accompanying drawings, namely, FIGS. 5, 6 and 7. Throughout the drawings, like reference numerals and letters are used to designate elements like or equivalent to those used in FIGS. 1 to 4 (Prior Art Circuits) for the sake of simplicity of explanation.

Figure 5:
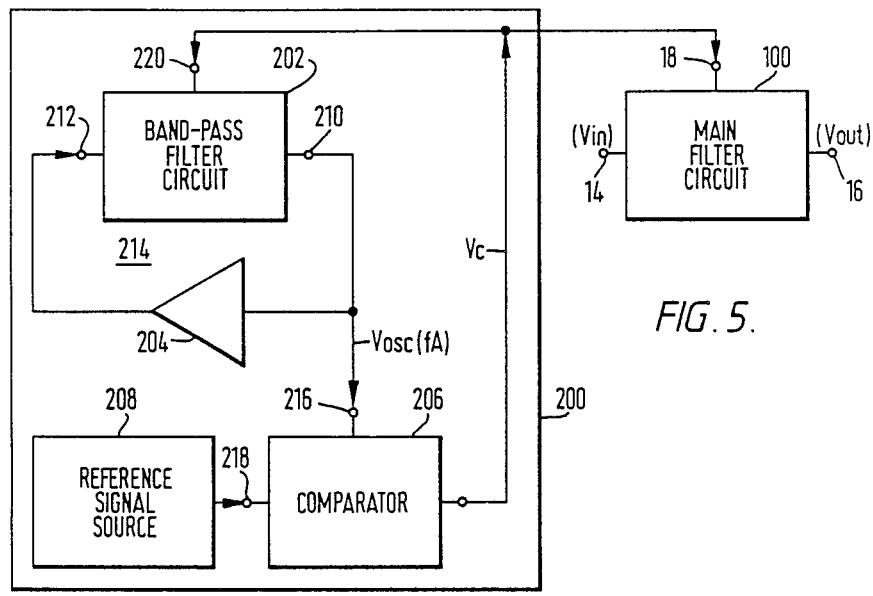
FIG. 5 is a block circuit diagram to show an embodiment of the time constant automatic adjustment circuit of this invention in a filter circuit.

FIG. 5 is a block diagram showing an embodiment of the automatically adjustable filter circuit according to the present invention. In FIG. 5, the embodiment of the automatically adjustable filter circuit is comprised of a main filter circuit 100 and a time constant automatic adjusting circuit 200.

Figure 3:
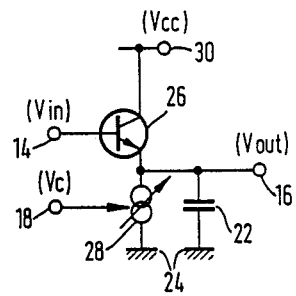
Figure 4:
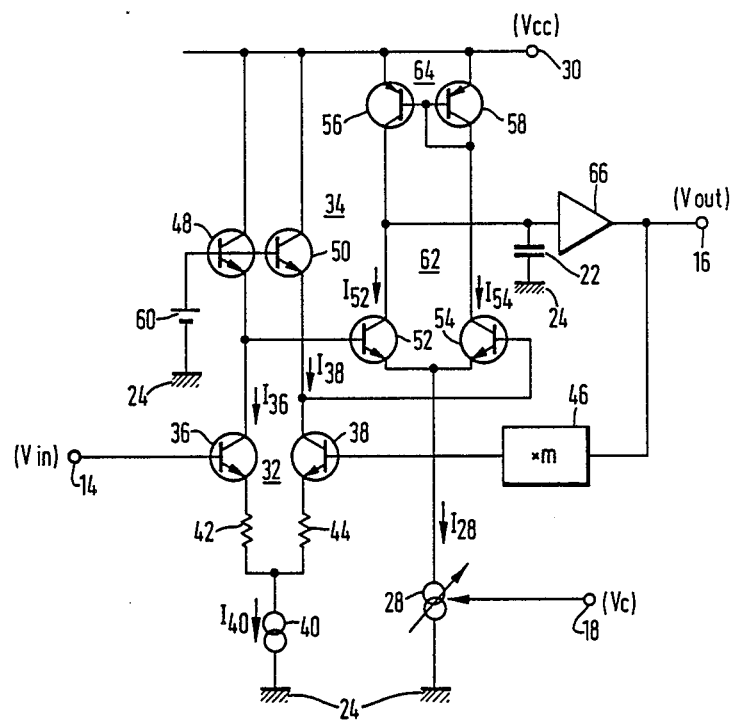

The main filter circuit 100 has an input terminal 14 for receiving an input signal Vin, an output terminal 16 for supplying an output signal Vout and a control terminal 18 for receiving a control signal Vc which will be described later. The main filter circuit 100 is made in the circuit configuration with a variable time constant. The time constant is controlled by the control signal Vc applied to the control terminal 18. For example, the main filter circuit 100 may have the circuit configuration, as shown in FIG. 4. However, any other filter circuit configuration like the circuits shown in FIGS. 1 to 3 also may be used for the main filter circuit 100.

The time constant automatic adjusting circuit 200 is comprised of a band-pass filter circuit 202, an amplifier 204, a comparator 206 and a reference signal source 208. The band-pass filter circuit 202 is made using two sets of filter circuits which have a circuit configuration the same as the main filter circuit 100. An output terminal 210 of the band-pass filter circuit 202 is coupled to the input terminal 212 thereof through the amplifier 204, so that the output of the band-pass filter circuit 202 is positively fed back to the input terminal 212. According to the feed-back connection, the circuit arrangement comprised of the band-pass filter circuit 202 and the amplifier 204 operates as an oscillator 214 oscillating at a prescribed frequency fA. The oscillation output Vosc with the frequency fA of the oscillator 214, i.e., the output of the band-pass filter circuit 202, is applied to one input terminal 216 of the comparator 206. Another input terminal 218 is connected to the reference signal source 208 for receiving a reference frequency signal Vrf with a reference frequency fR.

The comparator 206 compares the oscillation signal Vosc and the reference frequency signal Vrf in their phases and/or frequencies so that the comparator 206 generates the control signal Vc according to the phase (or frequency) difference between the oscillation signal Vosc and the reference frequency signal Vrf. The control signal Vc is fed back to the control terminal 220 of the band-pass filter 202. As a result, the oscillation frequency fA of the oscillator 214 is automatically controlled so as to coincide with the reference frequency fR. Therefore, the time constant of the band-pass filter 202 is always adjusted to a prescribed fixed value.

The control signal Vc is also fed to the control terminal 18 of the main filter circuit 100. The main filter circuit 100 is made in the same circuit configuration as the band-pass filter 202 in the time constant automatic adjusting circuit 200, as described above. As a result, the time constant of the main filter circuit 100 is also adjusted automatically to its own fixed value.

Figure 6:
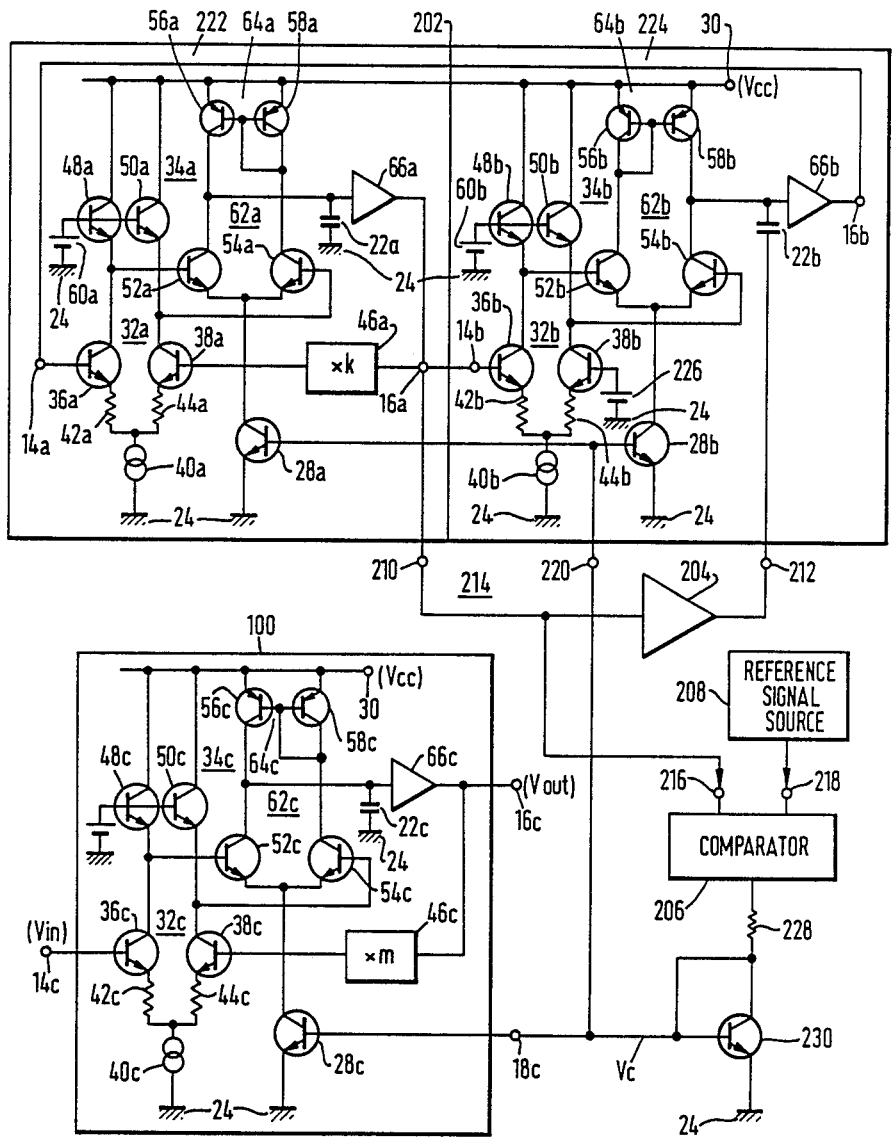
FIG. 6 is a circuit diagram to show a practical circuit configuration of the embodiment of FIG. 5.

Referring now to FIG. 6, an exemplified practical circuit arrangement for the automatic time constant adjustable filter circuit of FIG. 5 will be described. In FIG. 6, the main filter circuit 100 is constructed by using the filter circuit configuration as shown in FIG. 4. Accordingly, the band-pass filter circuit 202 is also constructed by using two sets of the same filter circuit configuration, as shown in FIG. 4. Then, the same or equivalent elements and portions as FIGS. 4 and 5 are shown with same reference numerals, and the explanations therefor will be omitted. However, some letters will be affixed to the reference numerals for necessary differentiation.

The band-pass filter circuit 202 comprises first and second integrating circuits 222 and 224 of the same filter circuit configuration as the main filter circuit 100, as described above. The first and second integrating circuits 222, 224 are different from each other in the following ways. In the first integrating circuit 222, the base of the transistor 38a of the first differential amplifier 32a is coupled to the output terminal 16a through the voltage divider 46a for receiving back the output signal Vout−A of the first integrating circuit 222. The voltage divider 46a multiplies the output voltage Vout−a to k times (k is a decimal number, i.e., k<1). By contrast, in the second integrating circuit 224, the base of the transistor 38b of the first differential amplifier 32b is coupled to a reference voltage source 226.

The output terminal 16a of the first integrating circuit 222 and the input terminal 14b of the second integrating circuit 224 are connected to each other. That is, the output of the buffer amplifier 66a of the first integrating circuit 222 is coupled to the base of the transistor 36b of the first differential amplifier 32b of the second integrating circuit 224. The output terminal 16b of the second integrating circuit 224 and the input terminal 14a of the first integrating circuit 222 are connected to each other. That is, the output of the buffer amplifier 66b of the second integrating circuit 224 is coupled to the base of the transistor 36a of the first differential amplifier 32a of the first integrating circuits 222. Further, the output terminal 16a of the first integrating circuit 222 is coupled to the other end of the capacitor 22b of the second integrating circuit 224 through the amplifier 204 in a feed-back loop. That is, in the second integrating circuit 224, the capacitor 22b is coupled to the amplifier 204, instead of the grounded terminal 24. According to the circuit connection among the first and second integrating circuits 222, 224 and the feed-back loop amplifier 204, the oscillator 214 is constituted.

Further, the output terminal 16a of the first integrating circuit 222 is coupled to the one input terminal of the comparator 206. The output terminal 216 of the comparator 206 for supplying the control signal Vc is coupled to grounded terminal 24 through a series circuit of a resistor 228 and a transistor 230. The collector of the transistor 230 is coupled to its base so that the transistor 230 has a diode fashion. The base of the transistor 230 is coupled to the variable current source sections of the first and second integrating circuits 222, 224 of the band-pass filter circuit 202 and the main filter circuit 100. Here, in the first and second integrating circuits 222, 224 of the band-pass filter circuit 202 and the main filter circuit 100, the variable current sources, which correspond to the variable current source 28, are constituted by transistors 28a, 28b and 28c, respectively. The transistors 28a, 28b and 28c form a current mirror circuit together with the transistor 230. Thus, the control signal Vc generated from the comparator 206 is introduced to the first and second integrating circuits 222, 224 of the band-pass filter circuit 202 and the main filter circuit 100, respectively.

The operation of the circuit arrangement of FIG. 6 now will be described. The oscillation output Vosc of the oscillator 214, i.e., the output signal Vout−a of the first integrating circuit 222, is compared in phase with the reference frequency signal Vref in the comparator 206, and the control voltage Vc is generated from the comparator 206 in response to the phase difference between the oscillation output Vosc and the reference frequency signal Vrf. This control voltage VC is fed to the transistors 28a, 28b and 28c through the transistor 230 constituting the current mirror circuit, respectively.

The first and second integrating circuits 222, 224 are of the same filter circuit configuration as the main filter circuit 100, as described above. The input and output characteristics of the first and second integrating circuits 222, 224 are both expressed by the following equations (6) and (7), similar to the equation (5). That is, in reference to the first integrating circuit 222:

$$Vout-a/Vin-a = 1/[k + j \cdot w \cdot C22a \cdot (R42a + R44a) \cdot I40a/(2 \cdot I28a)] \quad (6)$$

In the second integrating circuit 224, the input terminal 14 receives the output signal Vout−a of the first integrating circuit 224. The output signal Vout−b is present at the output terminal 16b and the output terminal 16b also receives an output signal Vout−d of the feedback amplifier 204. The output signal Vout−b is equal to the input signal Vin−a of the first integrating circuit 222. Therefore, in reference to the second integrating circuit 224, the following equation is obtained:

$$(Vin-a - Vout-d)/Vout-a = 1/[j \cdot w \cdot C22b \cdot (R42b + R44b) \cdot I40b/(2 \cdot I28b)] \quad (7)$$

From the equations (6) and (7), the following equation is obtained:

$$Vout-a/Vout-d = j \cdot w \cdot T2/[1 + j \cdot w \cdot k \cdot T2 + (j \cdot w)^2 \cdot T1 \cdot T2] \quad (8)$$

wherein, $T1 = C22a \cdot (R42a + R44a) \cdot I40a/(2 \cdot I28a)$, $T2 = C22b \cdot (R42b + R44b) \cdot I40b/(2 \cdot I28b)$.

Accordingly, a relation of $T1 = T2 = T$ is provided between the time constants, the oscillation frequency fA caused by the positive feedback is given as follows:

$$fA = \tfrac{1}{2} \cdot \pi \cdot T$$

When it is assumed that the collector currents of the transistors 28a, 28b and 28c are made equal to each other, the currents of the current sources 40a, 40b and 40c are made equal to each other and the resistances R42a and R42c are equal to the resistances R44a and R44c, rspectively, the time constant T3 of the band-pass filter 202 becomes as follows:

$$T3 = (1/m) \cdot (C22c/C22a) \cdot (R42c/R42a) \cdot (\tfrac{1}{2} \cdot \pi \cdot fA) \quad (9)$$

Figure 7:
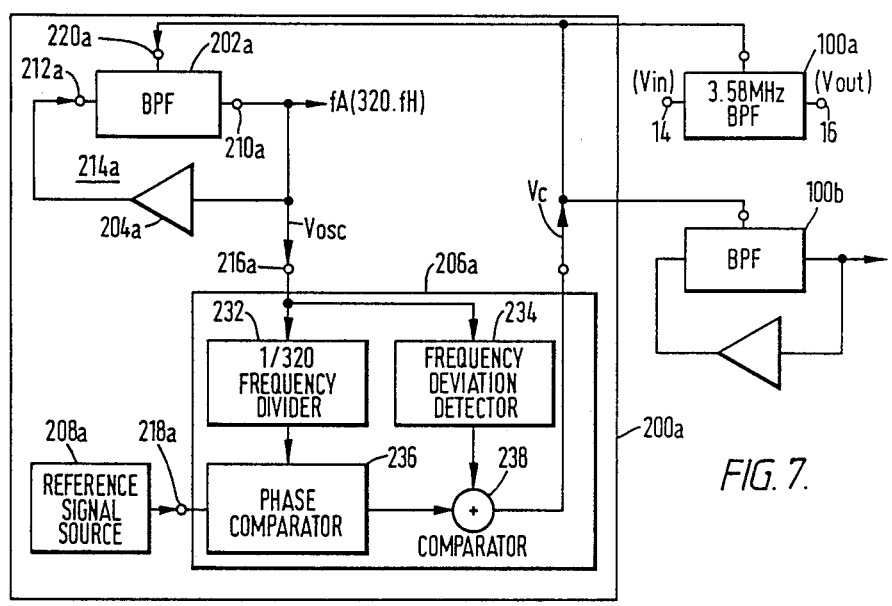
FIG. 7 is a block circuit diagram of the present invention as applied to a band-pass filter employed in a color signal processing circuit of a video tape recorder.

Referring now to FIG. 7, another embodiment of the filter circuit according to the present invention will be described. Here, the same or equivalent elements as FIG. 5 are shown with the same reference numerals attached, and the explanation is omitted. The embodiment shows a time constant automatic adjustable filter circuit adapted as a color signal processing circuit of a video tape recorder. In FIG. 7, the embodiment of the time constant automatic adjustable filter circuit, i.e., the color signal processing circuit is comprised of a 3.58 MHz band-pass filter circuit 100a, a time constant automatic adjusting circuit 200a and additional band-pass filter filter 100b. The band-pass filter circuit 100b is used as, for example, a band-pass filter circuit of an FM (frequency modulation) modulator of the video tape recorder.

The 3.58 MHz frequency band-pass filter circuit 100a is made using two sets of filter circuits which have the circuit configuration identical with the main filter circuit 100 of FIG. 5. The additional band-pass filter circuitt 100b also is made using two sets of filter circuits which have the circuit configuration identical with the main filter circuit 100 of FIG. 5.

The time constant automatic adjusting circuit 200a principally has the circuit configuration identical with the time constant automatic adjusting circuit 200 of FIG. 5. That is, the time constant automatic adjusting circuit 200a is comprised of a band-pass filter circuit 202a, an amplifier 204a, a comparator 206a and a reference signal source 208a. In the color signal processing of video signals, a frequency signal of 320·fH is required (fH is the frequency of the horizontal synchronous signal). Thereupon, the band-pass filter 202 is set so that the central frequency fA thereof is 320·fH. Then, the comparator 206a is comprised of a 1/320 frequency divider 232, a frequency deviation detector 234, a phase comparator 236 and an adder 238. The 1/320 frequency divider 232 and the frequency deviation detector 234 are coupled in parallel to the oscillator 214 for receiving the oscillation output Vosc. The 1/320 frequency divider 232 applies the phase comparator 236 with its frequency divided signal to one input terminal of the phase comparator 236. Another input terminal of the phase comparator 236 is coupled to the reference signal source 208a. Thus, the reference signal source 208a is set so that the reference frequency signal Vrf has the horizontal synchronous frequency fH in this embodiment. Then, the phase comparator 236 produces a phase detection output in response to the phase difference bewteen the frequency divided signal from the 1/320 frequency divider 232 and the reference frequency signal Vrf from the reference signal source 208a. The phase detection output is applied to one input terminal of the adder 238. The frequency deviation detector 234 distinguishes whether the actual frequency fA of the oscillation signal Vosc is in a prescribed frequency range at the central frequency of 320·fH, e.g., the frequency range of 320·fH±10%. The frequency deviation detector 234 does not produce any output when the actual frequency fA of the oscillation signal Vosc is in the frequency range. The frequency deviation detector 234 produces a positive frequency deviation detection output when the actual frequency fA of the oscillation signal Vosc increasingly deviates out of the frequency range. The frequency deviation detector 234 produces a negative frequency deviation detection output when the actual frequency fA of the oscillation signal Vosc decreasingly deviates out of the frequency range. The frequency deviation detection output is applied to another input terminal of the adder 238. The sum of the phase detection output from the phase comparator 236 and the frequency deviation detection output from the frequency deviation detector 234, i.e., the control signal Vc, is fed back from the adder 238 to the band-pass filter circuit 202a. Thus, the oscillation signal Vosc is automatically controlled so that its frequency fA always coincides with the frequency of 320·fH.

The comparator 206a of FIG. 7 could be constituted by the phase comparator 236, but without using the frequency deviation detector 234. However, since the oscillation frequency fA of the oscillator 214a has a large dispersion compared with, for example, LC type oscillators constituted by inductors (L) and capacitors (C), the phase lock of the feed-back loop is hardly established. The frequency deviation detector 234 serves to compensate the easy establishment of the phase lock.

The control signal Vc obtained in such a way is also applied to the 3.58 MHz band-pass filter 100a for color signal processing. In this case, the 3.58 MHz band-pass filter 100a has the same circuit configuration as the band-pass filter circuit 202a in the time constant automatic adjusting circuit 200a, as described before. Thus, the time constant of the 3.58 MHz band-pass filter 100a is always adjusted automatically to a prescribed fixed value related to the central frequency of 3.58 MHz. The central frequency of the 3.58 MHz band-pass filter 100a is set to 0.712 times the central frequency fA of the band-pass filter circuit 202a. Thus, the central frequency of the 3.58 MHz band-pass filter 100a is automatically adjusted to the frequency of 3.58 MHz. Further, when additional band-pass filter 100b, e.g., the band-pass filter circuit of the FM modulator of the video tape recorder (in the drawing, the modulator section is omitted), is equipped with the 3.58 MHz band-pass filter 100a, the additional band-pass filter 100b is also automatically adjusted to its prescribed central frequency.

Figure 2:
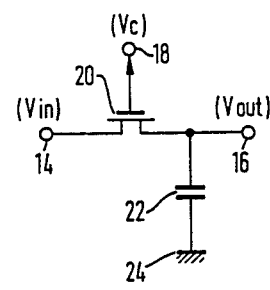

The present invention is not limited to these embodiments. For example, even in case that the filter circuits shown in FIGS. 1, 2 and 3 are employed as the main filter circuit 100, and the band-pass filter 202 of the same filter circuit configuration as the main filter circuit 100 is employed, similar results can be obtained. In addition to this, the invention may be modified in various ways without departing from the scope or spirit of the invention.

What is claimed is:

1. An automatic adjustment circuit for adjusting a filter circuit, the filter circuit having a time constant, the adjustment circuit adjusting the time constant and receiving a reference frequency signal, said adjustment circuit comprising:
   oscillation means for generating an oscillation signal, said oscillation means including a time constant variable filter and a feedback amplifier connected to said variable filter for positive feedback; and
   means for detecting a difference in phase between said reference frequency signal and said oscillation signal and generating a control signal for automatically adjusting the time constant of the filter circuit.

2. The adjustment circuit of claim 1 wherein the detecting means includes a phase detector and a frequency detector and means for supplying the control signal both to the filter circuit and the time constant variable filter.

3. The adjustment circuit of claim 1 wherein the filter circuit includes a main filter and the time constant variable filter has the same configuration as the main filter.

4. The adjustment circuit of claim 2 wherein the detecting means includes a frequency divider.

5. A method for adjusting a time constant of a filter circuit comprising the steps of:
   generating an oscillation signal using a combination of a variable filter and an amplifier connected to provide positive feedback to said filter;
   comparing the phase of said oscillation signal with the phase of a reference frequency signal;
   generating a control signal in response to a difference in phase between said oscillation signal and said reference frequency signal; and
   adjusting said time constant of said filter circuit with said control signal.

6. The method of claim 5 also including the step of adjusting the time constant of the variable filter with the control signal.

7. An automatic adjustment circuit for adjusting a filter circuit, the filter circuit having a time constant, the adjustment circuit adjusting the time constant and receiving a reference frequency signal, said adjustment circuit comprising:
   oscillation means for generating an oscillation signal, said oscillation means including a time constant and variable filter, a feedback amplifier connected to said variable filter for positive feedback; and
   means for detecting a difference in frequency between said reference frequency signal and said oscillation signal and generating a control signal for automatically adjusting the time constant of said filter circuit.

8. A method for adjusting a time constant of the filter circuit comprising the steps of:
generating an oscillation signal using a combination of a variable filter and an amplifier connected to provide positive feedback to said filter;
comparing the frequency of said oscillation signal with the frequency of a reference frequency signal;
generating a control signal in response to a difference in frequency between said oscillation signal and said reference frequency signal; and
adjusting said time constant of said filter circuit with said control signal.

9. The method of claim 8 also including the step of adjusting the time constant of the variable filter with the control signal.

* * * * *